United States Patent [19]

McShane et al.

[11] Patent Number: 5,006,922
[45] Date of Patent: Apr. 9, 1991

[54] PACKAGED SEMICONDUCTOR DEVICE HAVING A LOW COST CERAMIC PGA PACKAGE

[75] Inventors: Michael B. McShane; Paul T. Lin; Howard P. Wilson, all of Austin, Tex.

[73] Assignee: Motorola, Inc., Schaumburg, Ill.

[21] Appl. No.: 480,386

[22] Filed: Feb. 14, 1990

[51] Int. Cl.$^5$ ...................... H01L 23/50; H01L 23/04
[52] U.S. Cl. ........................................ 357/74; 357/72; 357/79; 361/400
[58] Field of Search ....................... 357/74, 78, 72, 74, 357/75, 79; 361/400, 386; 310/344; 437/215

[56] References Cited

U.S. PATENT DOCUMENTS

| | | | |
|---|---|---|---|
| 4,338,621 | 7/1982 | Braun | 357/74 |
| 4,630,096 | 12/1986 | Drye et al. | 357/81 |
| 4,639,631 | 1/1987 | Chason et al. | 310/344 |
| 4,692,839 | 9/1987 | Lee et al. | 357/81 |
| 4,750,092 | 6/1988 | Werther | 361/386 |
| 4,791,075 | 12/1988 | Lin | 437/209 |
| 4,861,944 | 8/1989 | Jones, II et al. | 174/68.5 |
| 4,897,711 | 1/1990 | Blonder et al. | 357/74 |

FOREIGN PATENT DOCUMENTS

| | | | |
|---|---|---|---|
| 59-186349 | 10/1984 | Japan | 357/74 |
| 62-52953 | 3/1987 | Japan | 437/215 |
| 63-60547 | 3/1988 | Japan | 357/74 |
| 63-110758 | 5/1988 | Japan | 357/74 |
| 63-199451 | 8/1988 | Japan | 357/74 |
| 63-211778 | 9/1988 | Japan | 357/74 |
| 63-253657 | 10/1988 | Japan | 357/74 |
| 63-261860 | 10/1988 | Japan | 357/74 |

OTHER PUBLICATIONS

Ceramic Through-Hole Pinning; J. D. Larnerd et al., Proc. 35th IEEE, Electronic Components Conference, p. 465, 1985.
Low Cost Pin Grid Array Packages; C. H. Brown, Solid State Technol., 18(5), p. 239, May 1985.
A Unique Low Cost Pin Grid Array Package with Heat Spreader; M. McShane, P. Lin and H. Wilson, Proc. 39th Ann. Int. Elect. Pack. Conf., p. 199, Sep. 11, 1989.

Primary Examiner—Andrew J. James
Assistant Examiner—Viet Q. Nguyen
Attorney, Agent, or Firm—Jasper W. Dockrey

[57] ABSTRACT

An improved packaged semiconductor device is provided having an electronic component, such as an integrated circuit, enclosed within a single layer ceramic PGA package. A cap, of substantially the same areal dimension as the base, is sealed to the base forming a cavity in which the integrated circuit is mounted. Input/output pins are attached to through-holes in the base and extend through the base and are exposed by holes in the cap aligned to the through-holes in the base. Extensive glass sealing of the cap to the base, made possible by the substantially co-extensive nature of the cap with respect to the base, provides a sturdy highly reliable seal making the packaged semiconductor device better able to withstand mechanical stress.

22 Claims, 2 Drawing Sheets

PACKAGED SEMICONDUCTOR DEVICE HAVING A LOW COST CERAMIC PGA PACKAGE

BACKGROUND OF THE INVENTION

This invention relates in general to semiconductor devices and more particularly to semiconductor devices including an electronic component, such as an integrated circuit, enclosed within a ceramic package.

In order to address packaging needs of high performance, very-large-scale-integration (VLSI) devices, semiconductor manufactures have largely adapted ceramic pin grid array (PGA) type packages for many VLSI applications. State of the art ceramic packaging offers good thermal conduction, relatively low thermal expansivity, and can be hermetically sealed. Improved thermal dissipation can be achieved by mounting the IC within the central cavity of the PGA package with the back side of the IC bonded to an upper surface of the cavity, which is known in the art as a cavity down configuration. The cavity down configuration allows a heat dissipation structure to be conveniently mounted to the upper surface of the PGA package. A cap is then hermetically sealed over the cavity. The package must be hermetically sealed to prevent moisture and contaminants from entering the package after assembly and corroding the package connections and contact pads on the IC enclosed with the package. The cap must be carefully sealed in place to provide maximal protection for the enclosed IC. Expansion and contraction of the package with ambient temperature changes over a period of time, as well as mechanical stress from handling and board placement, can result in a loss of the hermetic seal. A major disadvantage of the PGA package is that it is very expensive to produce and can represent a significant portion of the total cost of the packaged semiconductor device. As the IC integration level advances from VLSI to ultra-large-scale-integration (ULSI) ceramic packaging cost will consume an even greater portion of the total production cost.

The search for a low cost ceramic package led to the development of ceramic dual-inline-packages or "cerdip" packaging where ceramic powder is pressed to form a desired shape, then a standard leadframe is glass bonded to the pressed ceramic base. The cerdip package provides a low cost, hermetically sealed ceramic package, but the use of a conventional leadframe limits the number of leads available for connection to the IC. Other versions of cerdip packages are used with side brazed pins, however, these still lack the pin count necessary for high performance VLSI applications. Leadless chip carriers have been fabricated with ceramic material providing a high lead count alternative to cerdip packages, however, these packages are expensive to fabricate and thus do not provide a low cost ceramic package alternative. Despite the availability of low cost ceramic packaging in other formats, the PGA package remains the most widely used package format for high pin count VLSI applications.

Various approaches to addressing the problem of low cost PGA packaging meeting the requirements of hermeticity, strength and low thermal resistance for adequate heat dissipation are the subject of ongoing development within the semiconductor industry. Accordingly, a need existed for a packaged semiconductor device, in a low cost ceramic PGA format wherein the PGA package has a single-layer base and a hermetically sealed ceramic cap that is well seated to the package base.

BRIEF SUMMARY OF THE INVENTION

An object of the invention is to provide an improved packaged semiconductor device having a low cost, single-layer, hermetically sealed ceramic PGA package.

Another object of the invention is to provide an improved PGA packaged semiconductor device having a well seated, hermetically sealed ceramic cap.

Yet another object of the invention is to provide an improved low cost ceramic PGA having a low thermal resistance.

These and other objects and advantages of the invention are achieved, in one embodiment, by a packaged semiconductor device having a ceramic cap glass-sealed to the base that is of substantially the same dimensions as the base and is substantially co-extensive with the base. The base and the cap have a plurality of corresponding holes therein which are aligned with each other. A series of I/O pins are mechanically attached to through-holes in the base extending through the base and are exposed by the holes in the cap. The holes in the cap allow the I/O pins to extend through the cap, or in one embodiment, be electrically contacted by an external device. Extensive glass sealing of the ceramic cap to the base provides a sturdy highly reliable seal making the packaged semiconductor device better able to withstand mechanical stress.

In accordance with one embodiment of the invention, an integrated circuit is bonded to a predetermined location on a base. The base has a plurality of through-holes in which I/O pins attached to the base and electrically coupled with the integrated circuit by screen printed metal leads and interconnects. A cap, of substantially the same dimension and material as the base, having an indented surface portion and a plurality of holes aligned to the through-holes in the base, is bonded to preselected portions of the base. The alignment of the holes in the cap to the through-holes in the base exposes portions of the I/O pins attached to the base. Together, the base and the indented cap form a hermetically sealed cavity around the integrated circuit wherein the cap is sealed to the base at selected places across one surface of the base.

It will be appreciated that in the Figures the proportions of the various parts are not to scale. For example, the dimensions of some of the elements are exaggerated relative to each other for clarity.

DETAILED DESCRIPTION OF THE PREFERRED EMBODIMENTS

Figure 1:
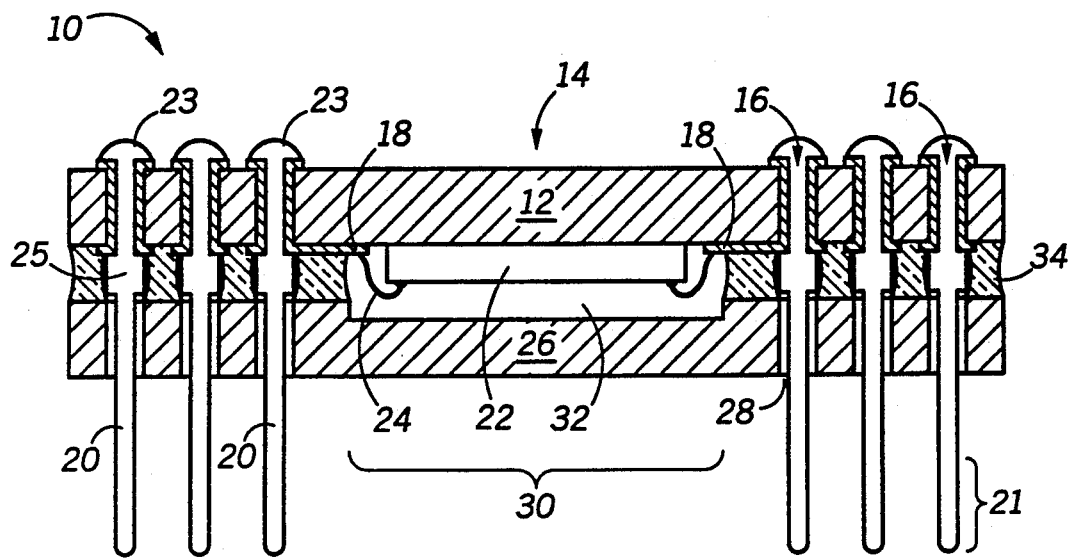
FIG. 1 illustrates, in cross section, one embodiment of a single-layer, ceramic packaged semiconductor device according to the invention.

Shown in FIG. 1, in cross section, is one embodiment of a packaged semiconductor device according to the present invention in a cavity down configuration. In a cavity down configuration, the enclosed semiconductor device is mounted face down, on an upper surface of a cavity within the package. The reverse mounting places the semiconductor device within the package away from the substrate supporting the package and in close proximity to means for removing heat generated by the component. Proper selection of materials and construction techniques, coupled with a cavity down configuration, can provide excellent thermal dissipation in a low cost ceramic package. In addition, a heat sink can be mounted adjacent to and in thermal contact with the semiconductor device or on the opposite side of a die bond area on the package base.

In FIG. 1, a cavity down type packaged semiconductor device 10 is shown which includes a base 12 having a die bond area 14 and a plurality of through-holes 16. Base 12 is preferably comprised of a pressed ceramic containing about 94 to 99% alumina ($Al_2O_3$) with the remaining portion comprising ceramic fillers, such as calcium and magnesium, and binding agents, such as PVC acetate, PMMA, or the like. The ceramic fillers and binding agents modify the mechanical, thermal and electrical properties of the alumina to allow proper shaping and improve thermal conduction. In addition, these additives minimize the shrinkage of base 12 during the assembly process providing dimensional stability and improve the functional reliability of packaged semiconductor device 10. Alternatively, base 12 can be formed from other ceramic materials such as aluminum nitride (AlN) containing about 1 weight percent oxygen and co-fired with a refractory metal, such as tungsten. The placement of through-holes 16 in multiple rows near the edge of die bond area 14 permits minimal length package interconnections to be made which reduces the electrical resistance of the interconnections and allows a high density of I/O pins for a given base size.

A series of screen printed package leads 18 extend outwardly from die bond area 14 to through-holes 16 and cover the entire surface of through-holes 16. Package leads 18 are formed by screen printing an electrically conductive metal layer such as gold (Au), copper (Cu), silver (Ag), or the like and alloys of the same onto base 12. A lead (Pb)-borosilicate paste is added to the metal to improve the adhesion of package leads 18 to base 12. During the screen printing process, a vacuum is applied to through-holes 16 to draw the metal into the holes yielding a metal layer of uniform thickness coating the surface of through-holes 16. In keeping with the goal of providing a low cost PGA package, the screen printing process provides an economical thick film metallization method that is relatively simple compared to a photolithography and etching process or a refractory metal firing process used in many multi-layer PGA applications.

A number of I/O pins 20 are swaged into metal-lined through-holes 16 in base 12. The swaging process mechanically attaches I/O pins 20 to ceramic base 16 by forming a pin head 23 on one side of base 12 and a pin bulge 25 on the opposite side locking the pins in place. A tight seal is formed between the distal portions of package leads 18, that fill the annular space in through-holes 16 between base 12, and I/O pins 20. The swaging process also forms an electrical connection between package leads 18 and I/O pins 20. Input-output pins 20 have elongated distal ends 21 which are optionally lead-finished with a material such as solder or tin (Sn) for more reliable solder attachment to receptacles on a package mounting substrate such as a printed circuit board. Input/output pins 20 preferably comprise an alloy of zirconium (Zr) and Cu plated with nickel (Ni) and Au. Alternatively, I/O pins 20 may be made from other materials such as Ni and Au plated Kovar (a Ni-Fe-Cobalt (Co) alloy), alloy 42 (a Ni-iron (Fe) alloy), or the like. Through-hole pinning provides a highly automated, low cost pinning process with a very low total package cost per pin.

An integrated circuit 22 is bonded to die bond area 14 of base 12 with a silver-filled glass bonding material. The Ag bonding glass provides a void-free bond interface with thermal stability sufficient to withstand the high temperature metal sintering used during the assembly process. It will be appreciated that while the term "integrated circuit" is used throughout this description, that the invention contemplates other semiconductor devices in addition to integrated circuits, such as discrete devices, hybrid devices and the like, and considers them to be encompassed herein as well. Integrated circuit 22 is electrically connected to the proximal ends of package leads 18 by a series of interconnect leads 24. Interconnect leads 24 span die bond area 14 and are preferably wire bonded to bonding pads located on the face of IC 22 and to contact pads (not shown) on the proximal ends of package leads 18. Interconnect leads 24 are composed of aluminum wire with 1% silicon (Al/Si) which is ultrasonically wedge bonded to the bonding pads on IC 22 and to the contact pads on the proximal ends of package leads 18. In keeping with the objective of providing a low cost PGA package, the wire bonding process provides a low-cost interconnect formation process. Alternatively, interconnect leads 24 may be formed by other connection methods such as by a tape automated bonding (TAB) process.

In accordance with one embodiment of the invention, a cap 26, having a plurality of pin holes 28 engaging distal ends 21 of I/O pins 20, is hermetically glass-sealed to base 12 enclosing IC 22 and interconnect leads 24. Pin holes 28 are arranged in an array pattern that matches the spatial arrangement of I/O pins 20. Cap 26 is preferably formed of the same pressed ceramic material used to form base 12. Cap 26 has an indented portion 30 which aligns with die bond area 14 on base 12 to form a cavity 32 surrounding IC 22, interconnect leads 24 and the proximal ends of package leads 18. As previously described, the spatial arrangement of cavity 32 with respect to IC 22 is known in the art as a "cavity-down package configuration". A hermetic seal is formed between cap 26 and base 12 by a seal-glass 34. Seal-glass 34 is preferably a vitreous, lead (Pb)-zinc (Zn)-borosilicate glass having a sealing temperature of about 400 degrees centigrade. Alternatively, other vitreous or devitrifying glasses can be used, the selection of which depends upon the particular ceramic material used for base 12 and cap 26. It should be noted that cap 26, as shown in FIG. 1, has substantially the same areal dimension as base 12 and provides a considerable amount of surface area for sealing cap 26 to base 12. The substantially co-extensive surface areas of base 12 and cap 26 permits the formation of a high strength, hermetic seal between base 12 and cap 26 by providing a large amount of surface area for application of seal-glass 34. The high strength, hermetic seal between cap 26 and base 12 contributes to providing a high reliability packaged semiconductor device that is able to withstand mechanical stress from handling and assembly activities. Furthermore, internal package stress, caused by non-uniform thermal expansion and contraction of package members, is minimized by providing a package having a base and a cap of similar pressed ceramic material having uniform thermal expansivity.

Figure 2:
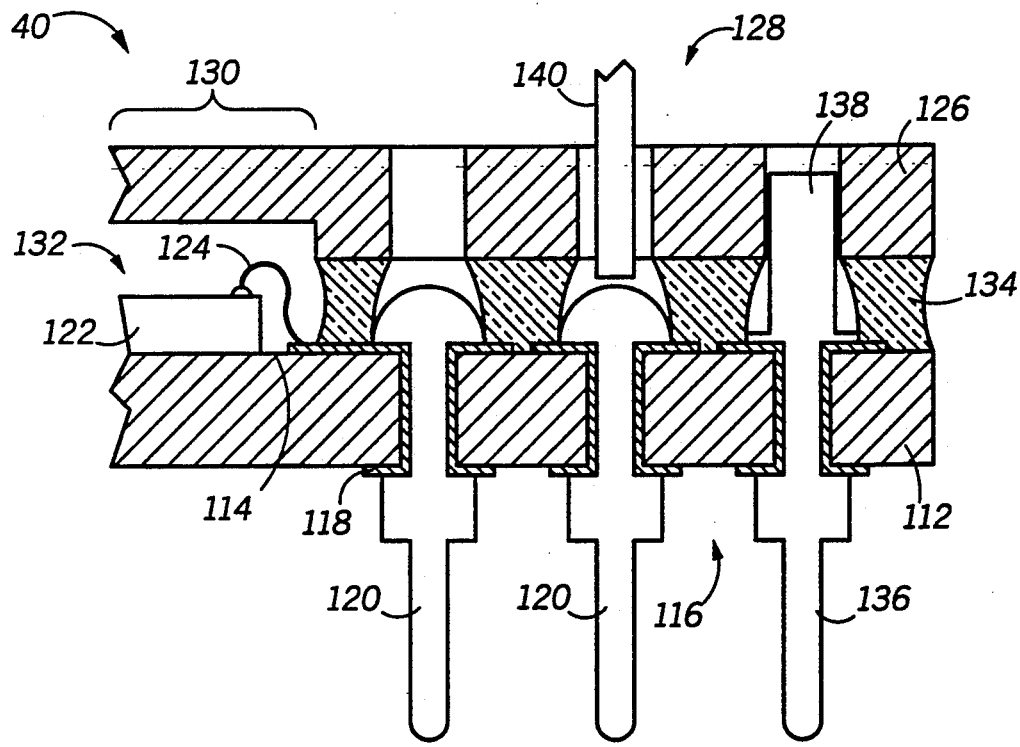
FIG. 2 illustrates, in cross section, another embodiment of a single-layer ceramic packaged semiconductor device according to the invention.

Another embodiment of a packaged semiconductor device 40, according to the invention, is shown in FIG. 2. In accordance with the invention, a single layer base 112 is provided having a cap 126, substantially co-extensive with base 112, overlying base 112. Both base 112 and cap 126 are formed from substantially the same material, which is preferably a pressed ceramic material as described previously. An IC 122 is mounted to a die bond area 114 located on the surface of base 112. Cap 126 has an indented portion 130 aligned to IC 122 which forms a cavity 132 when cap 126 is glass-sealed to base 112. The spatial arrangement of cavity 132 with respect to IC 122 is known in the art as a "cavity-up package configuration". A hermetic seal is formed by a seal-glass 134 disposed between selected portions of base 112 and cap 126. Seal-glass 134 is comprised of glass material similar to that previously described. Cap 126 has a series of holes 128 corresponding to, and aligned with, a plurality of through-holes 116 in base 112. A plurality of I/O pins 120 extend through through-holes 116 and are attached to base 112 by a swaging process analogous to that described previously. Cap 126 is aligned with base 112 such that holes 128 expose an end portion of I/O pins 120. A series of interconnects 124 and metal leads 118 electrically couple IC 122 with I/O pins 120.

The structure illustrated in FIG. 2 has several important advantages that arise, in part, from the substantially co-extensive nature of cap 126, and the alignment of holes 128 therein with through-holes 116 in base 112. The hole correspondence between cap 128 and base 112 permits the use of at least two alignment pins to assist in the alignment of cap 128 with base 112 during the assembly process. An alignment pin 136, has an elongated upper portion 138 that can be used to align cap 126 with base 112 by insertion into a predetermined one of holes 128 located in cap 126. Portion 138 of alignment pin 136, prevents the lateral movement of cap 126 during the glass sealing process used to bond cap 126 to base 112. The precise placement and mechanical stabilization of cap 126 to base 112, provided by alignment pin 136, results in a more reliable assembly process of packaged semiconductor device 40.

Another aspect of the embodiment shown in FIG. 2 includes the ability of holes 128 in cap 126 to act as external contact guides for I/O pins 120. Contacting of I/O pins 128 with for example, a test probe, is desirable in order to ascertain the level of functional performance of IC 122 prior to mounting packaged semiconductor device 40 to a substrate such as a printed circuit board. An external lead 140 can be inserted into any of holes 128 and make electrical contact with any of pins 128 which are electrically coupled to IC 122. External lead 140 can be attached to a test instrument (not shown) or, alternatively, external lead 140 can be an I/O pin from another packaged semiconductor device (not shown). In the case where external lead 140 is a test probe, the enhanced ability to test the level of functionality of IC 122 after placement of packaged semiconductor device 40 on a printed circuit board, reduces quality control costs associated with installation and testing of packaged semiconductor device 40 in a user system. In the case where external lead 140 is one of a plurality of I/O pins from another packaged semiconductor device, the ability to stack packaged semiconductor devices, such as packaged semiconductor device 40, enables an increase in functional capability of a user system for the same amount of substrate area as required by a single packaged semiconductor device.

Additionally, other types of devices may electrically access IC 122 by electrically contacting I/O pins 120 though holes 128 in cap 126. For example, at least one de-coupling capacitor (not shown) may be mounted on an exterior portion of cap 126 and electrically coupled with IC 122 by making contact with at least one of I/O pins 120. De-coupling capacitors are capable of reducing the package electrical noise level associated with capacitive coupling between signal leads and power and ground connections.

A further aspect of the embodiment shown in FIG. 2 relates to the ability of holes 128 in cap 126 to permit any excess seal glass to escape the bounds of the seal area during the high temperature glass sealing process and extrude into the space above I/O pins 120 provided by holes 128. The ability of any excess glass seal material to be extruded allows the formation of a seal having a uniform thickness and assists in maintaining the alignment of cap 126 to base 112 during the assembly process.

Figure 3:
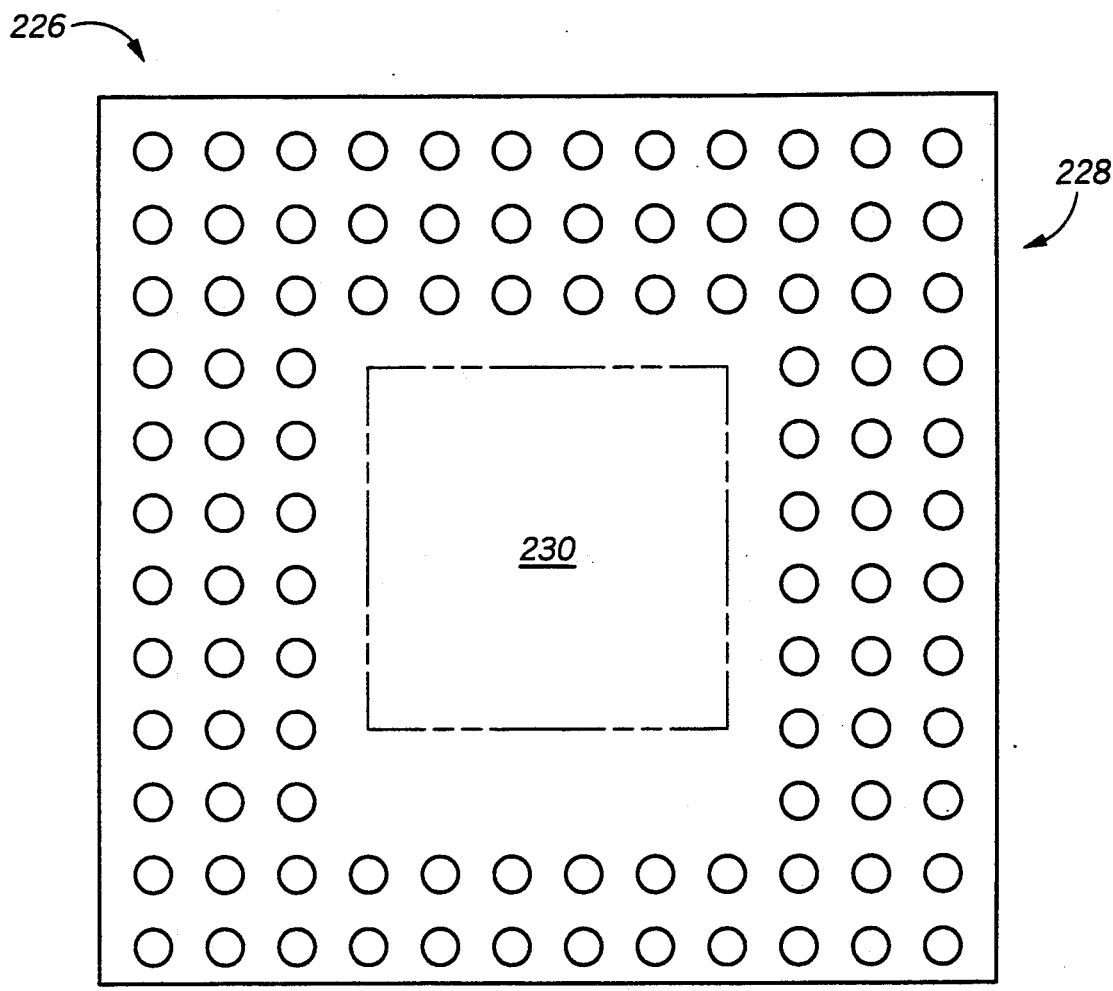
FIG. 3 is a top view of a ceramic cap, in accordance with the invention, having a plurality of holes for alignment with through-holes in a base and having substantially the same dimensions as the base.

A top view of a ceramic cap 226 according to one embodiment of the invention, is shown in FIG. 3. Ceramic cap 226 has a distributed array of holes 228 for engagement with a corresponding array of I/O pins attached to a base (not shown) of substantially the same areal dimension as cap 226. A cavity area 230 is shown in the central portion of ceramic cap 226 for alignment with the electronic component mounted to the die bond area of a base. Those skilled in the art will recognize that many other pin hole array patterns are possible and the invention is not intended to be limited to the array pattern illustrated in FIG. 3. For example, the pin holes may be arranged in an alternating row configuration, or in multiple parallel rows extending along opposite sides of cap 226 similar to a dual-inline-package configuration.

Thus it is apparent that there has been provided, in accordance with the invention, a packaged semiconductor device which fully meets the objects and advantages set forth above. Although particular embodiments of the invention have been described in the foregoing description, it will be apparent to one skilled in the art that numerous modifications and variations can be made to the presented embodiments which still fall within the spirit and scope of the invention. For example, the alumina material used to form the cap and the base may have a refractory metal such as tungsten incorporated therein. Furthermore, the I/O pins can be formed from other materials such as Au plated Cu. Accordingly, it is intended that all such variations and modifications as fall within the scope of the appended claims and equivalents thereof be included within the invention.

We claim:
1. A packaged semiconductor device comprising:
  a single-layer ceramic base having a first plurality of through-holes therein;
  an integrated circuit disposed at a predetermined location on said base;
  terminal means attached to said base extending through said first plurality of through-holes in said base and having distal ends extending therefrom, said terminal means providing external electrical connection to said semiconductor device;
  a cap substantially co-extensive with said base having a second plurality of through-holes therein corre- sponding with and aligned to said first plurality of through-holes in said base, said cap bonded to said base forming a cavity between said base and said cap hermetically enclosing said integrated circuit within said cavity; and coupling means for electrically coupling said terminal means to said integrated circuit.

2. The packaged semiconductor device of claim 1 wherein said coupling means comprises:

patterned metal leads disposed on said base projecting outwardly from said cavity and forming an electrical contact with said terminal means; and metal interconnect leads electrically connected to said integrated circuit and bonded to said outwardly projecting patterned metal leads.

3. The packaged semiconductor device of claim 2 wherein said patterned metal leads overlie the surface of said first plurality of through-holes in said base.

4. The packaged semiconductor device of claim 3 wherein said terminal means comprise swaged I/O pins extending through said first plurality of through-holes in said base and spaced apart from said base by said patterned metal leads, each of said pins having a pin head situated above said base and a pin bulge situated below said base.

5. The packaged semiconductor device of claim 2 wherein said metal interconnect leads comprise wire bonds.

6. The packaged semiconductor device of claim 2 wherein said metal interconnect leads comprise TAB bonds.

7. The packaged semiconductor device of claim 1 wherein said cap is bonded to said insulating base by a layer of Pb-borosilicate glass disposed between said insulating cap and said insulating base.

8. The packaged semiconductor device of claim 1 wherein said cap further comprises an indented surface portion aligned with said integrated circuit disposed on said base forming a cavity between said base and said cap, said cavity in confronting relation to said integrated circuit.

9. A packaged semiconductor device comprising:

a single-layer ceramic base having a first plurality of through-holes therein;

an integrated circuit disposed at a predetermined location on said base;

a plurality of I/O pins extending through said first plurality of through-holes in said base and mechanically attached to said base and having distal ends extending therefrom;

a cap substantially co-extensive with said base having a second plurality of of through-holes therein aligned to said first plurality of through-holes in said base engaging said distal ends of said I/O pins and bonded said base forming a cavity between said base and said cap hermetically enclosing said integrated circuit within said cavity; and means electrically coupling said I/O pins to said integrated circuit.

10. The packaged semiconductor device of claim 9 wherein said means electrically coupling said I/O pins to said integrated circuit comprises:

patterned metal leads disposed on said base projecting outwardly from said cavity and forming an electrical contact with said I/O pins; and metal interconnect leads electrically connected to said integrated circuit and bonded to said outwardly projecting patterned metal leads.

11. The packaged semiconductor device of claim 10 wherein said patterned metal leads overlie the surface of said first plurality of through-holes in said base.

12. The packaged semiconductor device of claim 10 wherein said metal interconnect leads comprise wire bonds.

13. The packaged semiconductor device of claim 10 wherein said metal interconnect leads comprise TAB bonds.

14. The packaged semiconductor device of claim 9 wherein said cap is bonded to said insulating base by a layer of Pb-borosilicate glass disposed between said insulating cap and said insulating base.

15. The packaged semiconductor device of claim 9 wherein said cap further comprises an indented surface portion aligned with said integrated circuit disposed on said base forming a cavity between said base and said cap, said cavity in confronting relation to said integrated circuit.

16. A packaged semiconductor device comprising:

a single-layer ceramic base having a first plurality of through-holes therein;

an integrated circuit having a plurality of bonding pads thereon and mounted to said base at a predetermined location;

a plurality of I/O pins extending through said first plurality of through-holes in said base, said plurality of I/O pins mechanically attached to said base and having distal ends extending therefrom;

a cap substantially co-extensive with said base having a second plurality of of through-holes therein aligned to said first plurality of through-holes in said base, said cap bonded to said base forming a cavity between said base and said cap hermetically enclosing said integrated circuit within said cavity;

patterned metal leads disposed on said base projecting outwardly from said cavity to said first plurality of through-holes in said base, said patterned metal leads extending into said first plurality of through-holes forming an electrical contact to said I/O pins; and a series of metal interconnect leads electrically connected to said bonding pads of said integrated circuit at one end and electrically connected to said patterned metal leads at the other end.

17. The packaged semiconductor device of claim 16 wherein said metal interconnect leads comprise wire bonds.

18. The packaged semiconductor device of claim 16 wherein said metal interconnect leads comprise TAB bonds.

19. A packaged semiconductor device comprising:

a single-layer ceramic base having a first plurality of through-holes therein;

an integrated circuit disposed at a predetermined location on said base;

a plurality of I/O pins extending through said first plurality of through-holes in said base and mechanically attached to said base and having distal ends extending therefrom;

a cap overlying said base and substantially co-extensive with said base having a second plurality of of through-holes therein aligned to said first plurality of through-holes in said base and bonded to said base forming a cavity between said base and said cap hermetically enclosing said integrated circuit within said cavity; and means electrically coupling said I/O pins to said integrated circuit.

20. The packaged semiconductor device of claim 19 wherein said cap further comprises an indented surface portion aligned with said integrated circuit disposed on said base forming a cavity between said base and said cap, said cavity in confronting relation to said integrated circuit.

21. The packaged semiconductor device of claim 19 wherein said cap is bonded to said insulating base by a layer of Pb-borosilicate glass disposed between said insulating cap and said insulating base.

22. The packaged semiconductor device of claim 19 wherein said means electrically coupling said I/O pins to said integrated circuit comprises:
- patterned metal leads disposed on said base projecting outwardly from said cavity and forming an electrical contact with said I/O pins; and
- metal interconnect leads electrically connected to said integrated circuit and bonded to said outwardly projecting patterned metal leads.

* * * * *